US010366996B2

(12) United States Patent
Wong et al.

(10) Patent No.: US 10,366,996 B2
(45) Date of Patent: Jul. 30, 2019

(54) STABLE AND RELIABLE FINFET SRAM WITH IMPROVED BETA RATIO

(71) Applicant: GLOBALFOUNDRIES INC., Grand Cayman (KY)

(72) Inventors: Robert C. Wong, Poughkeepsie, NY (US); Lei Zhuang, White Plains, NY (US); Ananthan Raghunathan, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/704,598

(22) Filed: Sep. 14, 2017

(65) Prior Publication Data

US 2018/0012895 A1    Jan. 11, 2018

Related U.S. Application Data

(62) Division of application No. 15/151,622, filed on May 11, 2016, now Pat. No. 9,799,660.

(51) Int. Cl.

| H01L 27/11 | (2006.01) |
|---|---|
| H01L 23/31 | (2006.01) |
| H01L 21/56 | (2006.01) |
| H01L 21/308 | (2006.01) |
| H01L 21/3065 | (2006.01) |
| H01L 27/02 | (2006.01) |

(52) U.S. Cl.
CPC ...... *H01L 27/1104* (2013.01); *H01L 21/3065* (2013.01); *H01L 21/3085* (2013.01); *H01L 21/56* (2013.01); *H01L 23/3171* (2013.01); *H01L 27/0207* (2013.01)

(58) Field of Classification Search
None
See application file for complete search history.

(56) References Cited

U.S. PATENT DOCUMENTS

| 5,156,992 | A | 10/1992 | Teng et al. |
|---|---|---|---|
| 6,812,075 | B2 | 11/2004 | Fried et al. |
| 6,970,373 | B2 | 11/2005 | Datta et al. |
| 7,084,461 | B2 | 8/2006 | Anderson et al. |
| 7,681,628 | B2 | 3/2010 | Joshi et al. |
| 9,012,287 | B2 | 4/2015 | Liaw |
| 2008/0003833 | A1* | 1/2008 | Kim ............... H01L 27/10876 438/703 |
| 2012/0113708 | A1 | 5/2012 | Jung et al. |
| 2013/0270652 | A1 | 10/2013 | Liaw et al. |

(Continued)

*Primary Examiner* — Michelle Mandala
(74) *Attorney, Agent, or Firm* — David Cain; Hoffman Warnick LLC

(57) ABSTRACT

Fabrication method for a semiconductor memory device and structure are provided, which includes: providing at least two mask layers over a pair of fin structures extended above a substrate, wherein a first mask layer of the at least two mask layers is orthogonal to a second mask layer of the at least two mask layers; and patterning the pair of fin structures to define a pass-gate transistor, wherein the first mask layer facilitates removing of a portion of a first fin structure of the pair of fin structures to define a first pass-gate fin portion of the pass-gate transistor, and the second mask layer protects a second fin structure of the pair of fin structures to define a second pass-gate fin portion of the pass-gate transistor.

9 Claims, 9 Drawing Sheets

(56) References Cited

U.S. PATENT DOCUMENTS

2016/0005966 A1* 1/2016 Kim .................. H01L 45/16
                                                  438/127
2016/0197085 A1    7/2016 Ju et al.

\* cited by examiner

STABLE AND RELIABLE FINFET SRAM WITH IMPROVED BETA RATIO

FIELD OF THE INVENTION

The present invention relates to a semiconductor memory device and to a method of fabricating a semiconductor memory device, and more particularly, to a static random access memory (SRAM) device with an improved beta ratio.

BACKGROUND

Conventional static random-access memory (SRAM) devices are generally used in applications requiring high speed, such as, memory in a data processing system, and typically consist of six transistors (6T): two P channel field effect transistors (PFETs) for a pull-up operation, two N channel field effect transistors (NFETs) for pull down, and two NFETs for input/output (i.e. passgate) access. As the size of technology nodes continues to decrease, fin field-effect transistors (FinFETs) are introduced to replace planar transistors, during the fabrication of SRAM devices. As one skilled in the art will understand, the stability of a 6T SRAM cell, in general, is defined by a beta ratio which, for instance, is the ratio of the drive currents of the pull-down transistors to the drive currents of the respective pass-gate transistors.

FIG. 1 illustrates a top plan view of a typical 6T SRAM device 100. In the embodiment illustrated, the SRAM device 100 typically includes one or more regions, for instance, region A and region B. As one skilled in the art will understand, during conventional SRAM fabrication a large number of regions A and B are provided together on a substrate. As depicted, each of these regions A and B include, for instance, two pass-gate transistors 112 that are electrically coupled to two pull-down transistors 110 which, in turn, are electrically coupled to two pull-up transistors 108, respectively. Note that, as illustrated, each of the two pass-gate transistors 112 include two fin structures (referred to hereinafter as "fins") that allow electrically coupling of one pass-gate transistor 112 to an adjacent pass-gate transistor 112. Additionally, the two fins of the pass-gate transistors 112 also enable electrical coupling of the pass-gate transistor to the neighboring pull-down transistors 110, respectively. Although not depicted in the figures, one skilled in the art will understand that, a source region and a drain region are formed at opposite ends of each of the pass-gate FinFETs 112, pull-down FinFETs 110 and pull-up FinFETs 108.

Continuing with FIG. 1, an equal number of pull-down devices and pass-gate devices provide a tradeoff between the cell size and the cell speed. In this situation, the beta ratio is equal to 1. The unitary beta ratio, for instance, could lead to undesirable issues such as, access disturb. As one skilled in the art will understand, higher beta ratios are desirable to improve the stability of the SRAM cell, without increasing the overall size of the SRAM cell. As understood, regions, for instance, regions A and B, are expanded to form bigger cells which, for instance, are more stable because bigger FET features are relatively more precise.

Enhancements in semiconductor memory device structures and fabrication methods therefor continue to be desired for enhanced performance and commercial advantage.

BRIEF SUMMARY

Certain shortcomings of the prior art are overcome and additional advantages are provided through the provision, in one aspect, of a method for forming a semiconductor memory device which includes, for instance, providing at least two mask layers over a pair of fin structures extended above a substrate, wherein a first mask layer of the at least two mask layers is orthogonal to a second mask layer of the at least two mask layers; and patterning the pair of fin structures to define a pass-gate transistor, wherein the first mask layer facilitates removing of a portion of a first fin structure of the pair of fin structures to define a first pass-gate fin portion of the pass-gate transistor, and the second mask layer protects a second fin structure of the pair of fin structures to define a second pass-gate fin portion of the pass-gate transistor.

In a further aspect, a semiconductor memory device which includes, for instance, a static random-access memory (SRAM) cell including at least one pass-gate transistor and at least one pull-down transistor, wherein each of the at least one pass-gate transistor and the at least one pull-down transistor have a pair of fin structures extended above a substrate, and electrically coupled to each other, wherein a fin structure of the pair of fin structures is encapsulated within a gate structure of the at least one pass-gate transistor.

In yet another aspect, a method for forming a semiconductor memory device which includes, for instance, providing at least two mask layers over a pair of fin structures extended above a substrate, a first mask layer of the at least two mask layers being orthogonal to a second mask layer of the at least two mask layers, where the first mask layer of the at least two mask layers facilitates modulating stability of the semiconductor memory device, without affecting the second mask layer of the at least two mask layers.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
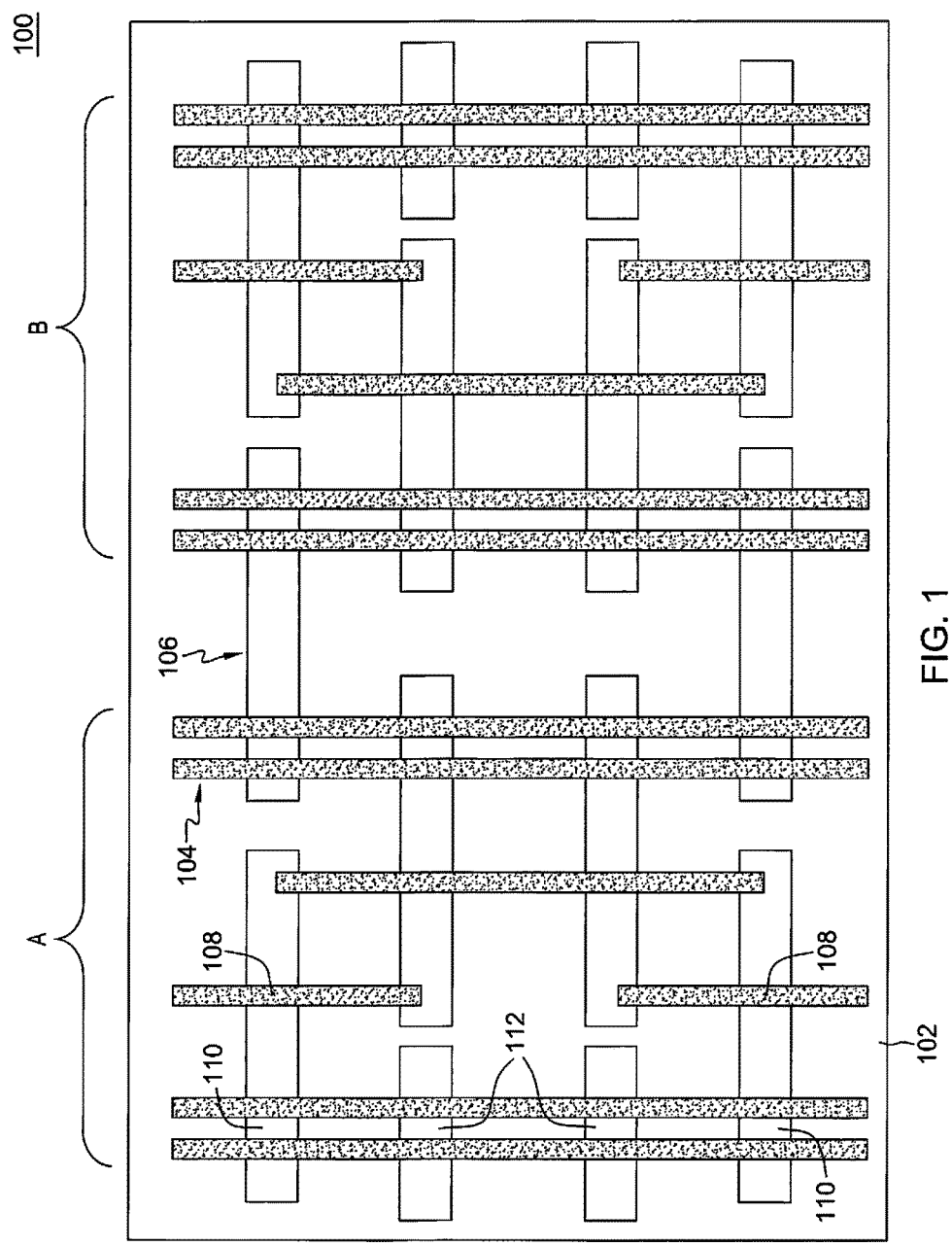
FIG. 1 depicts a plan view of one embodiment of a conventional SRAM device.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in details. It should be understood, however, that the detailed description and the specific examples, while indicating embodiments of the invention, are given by way of illustration only, and not by way of limitation. Various substitutions, modifications, additions and/or arrangements within the spirit and/or scope of the underlying inventive concepts will be apparent to those skilled in the art from this disclosure.

The present invention provides, inter alia, a fabrication method and a structure for a SRAM device with improved beta ratio. As described above, and in one aspect, during conventional FinFET fabrication processing, and in particular, during SRAM fabrication processing, one or more fin structures or fins residing over a substrate may be spaced apart, and during bulk FinFET or SRAM fabrication processing, more fins may have been created than required for a particular circuit or device. Thus, a fin cut or fin removal process is employed to remove one or more unwanted fin structures, in particular, at the pass-gate transistor of the SRAM device. Such removal of an unwanted fin and subsequent tucking of the unwanted fin within an overlying gate structure at the pass-gate transistor, for instance, could improve the beta ratio of a SRAM device. Disadvantageously, the conventional processing techniques employed could lead to inadvertently removing the adjacent fin along with the unwanted fin, thereby resulting in performance degradation of the resultant SRAM device. Additionally, the conventional processing techniques employed during the fin cut processing could, for instance, involve utilizing a pair of mask layers (e.g., lithographic mask layer and cut mask layer) to pattern the various cells of the SRAM device. For instance, the cut mask layer is conventionally employed to cut the pull-up fin. As one skilled in the art will understand, in the 14 nm and beyond technology nodes, the cut mask layer has been utilized to cut both the pull-up fin and the pass-gate fin, while in the technology nodes below 14 nm, the cut mask layer has been utilized to cut the pull-up fin, resulting in constraining the beta ratio of the SRAM device to be 1. Still further, the conventional processing techniques employed during the fin cut processing could, disadvantageously, result in rounding of a remaining fin portion. This rounding profile of the remaining fin portion may cause subsequent epitaxial growth problems at the source region and the drain region of the pass-gate transistor, and for at least this reasoning is undesirable.

In one aspect of the present invention, there is disclosed a method for forming a semiconductor memory device which includes, for instance, providing at least two mask layers over a pair of fin structures extended above a substrate, wherein a first mask layer of the at least two mask layers is orthogonal to a second mask layer of the at least two mask layers; and patterning the pair of fin structures to define a pass-gate transistor, wherein the first mask layer facilitates removing of a portion of a first fin structure of the pair of fin structures to define a first pass-gate fin portion of the pass-gate transistor, and the second mask layer protects a second fin structure of the pair of fin structures to define a second pass-gate fin portion of the pass-gate transistor.

In one embodiment, the patterning of the pair of fin structures with the first mask layer and the second mask layer provides the first pass-gate fin portion of the pass-gate transistor with squared edges. In such an embodiment, the fabrication method may include a gate structure extending at least partially over the pair of fin structures of the pass-gate transistor, and the first pass-gate fin portion of the pass-gate transistor is encapsulated within the gate structure, selective to the second pass-gate fin portion. Such encapsulation of the first pass-gate fin portion within the gate structure of the pass-gate transistor enhances a beta ratio of the semiconductor memory device.

In one implementation, the first mask layer may include a first lithographic mask layer and a cut mask layer, with the first lithographic mask layer being orthogonal to the cut mask layer. In such an implementation, the cut mask layer facilitates removing of the portion of the first fin structure. Further, the patterning of the pair of fin structures may include modifying the selective removal of the portion of the first fin structure with the cut mask layer to provide the first pass-gate fin portion with squared edges so as to facilitate encapsulation of the first pass-gate fin portion within the gate structure. In another implementation, the second mask layer may include a second lithographic mask layer, with the second mask layer being spaced parallel to the first lithographic mask layer. In such an implementation, the second mask layer and the first lithographic mask layer define the second fin portion of the pass-gate transistor.

In another embodiment, the fabrication method may include an additional first lithographic mask layer, with the additional first lithographic mask layer being spaced parallel to the first lithographic mask layer. In such an embodiment, the additional first lithographic mask layer defines a pull-up transistor, and the pull-up transistor is electrically coupled with the pull-down transistor. In yet another embodiment, the fabrication method may include an additional pass-gate transistor, with the additional pass-gate transistor including a first pass-gate fin portion and a second pass-gate fin portion, and the additional pass-gate transistor is in-line with the pass-gate transistor, where the first pass-gate fin portion of the second pass-gate transistor is electrically isolated from the first pass-gate fin portion of the pass-gate transistor, and the second pass-gate fin portion of the second pass-gate transistor is electrically coupled with the second pass-gate fin portion of the pass-gate transistor. In such an example, the electrical isolation of the first pass-gate fin portion of the pass-gate transistor and the first pass-gate fin portion of the additional pass-gate transistor enhances a beta ratio of the semiconductor memory device. For example, the enhanced beta ratio of the semiconductor memory device may be about 2.0 or more.

In another aspect of the present invention, there is provided a semiconductor memory device which includes, for instance, a static random-access memory (SRAM) cell including at least one pass-gate transistor and at least one pull-down transistor, where each of the at least one pass-gate transistor and the at least one pull-down transistor have a pair of fin structures extended above a substrate, and electrically coupled to each other, where a fin structure of the pair of fin structures is encapsulated within a gate structure of the at least one pass-gate transistor.

In yet another aspect of the present invention, there is provided a method for forming a semiconductor memory device which includes, for instance, providing at least two mask layers over a pair of fin structures extended above a substrate, a first mask layer of the at least two mask layers being orthogonal to a second mask layer of the at least two mask layers, where the first mask layer of the at least two mask layers facilitates modulating stability of the semiconductor memory device, without affecting the second mask layer of the at least two mask layers.

Reference is made below to the drawings, which are not drawn to scale for ease of understanding, wherein the same reference numbers used throughout different figures designate the same or similar components.

By way of example, FIGS. 2-8 depict one embodiment of a method for forming a semiconductor memory device, for example, a SRAM device with an improved beta ratio, in accordance with one or more aspects of the present invention. Advantageously, as described below, the two or more mask layers employed in the patterning of the fins facilitates selectively removing a portion of the unwanted fin, leaving a patterned fin with squared edges which, for instance, are encapsulated within an overlying gate structure, thereby creating an electrical isolation therein, and improving the beta ratio of the resultant SRAM device.

Figure 2:
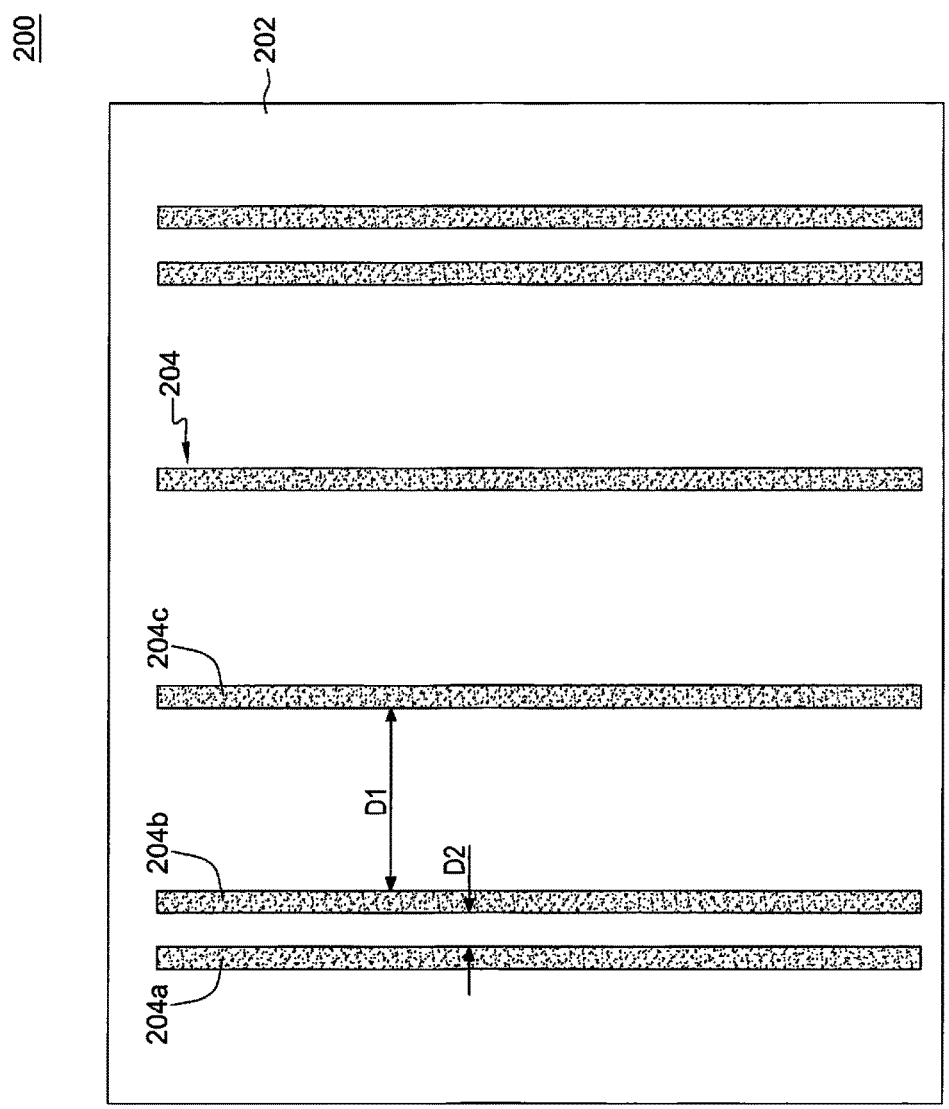
FIG. 2 depicts a plan view of one embodiment of a structure obtained during static random-access memory (SRAM) fabrication process, and illustrates one or more fins disposed over the substrate, in accordance with one or more aspects of the present invention.

FIG. 2 depicts a plan view of one embodiment of a structure 200 obtained during static random-access memory (SRAM) fabrication process, in accordance with one or more aspects of the present invention. In the example shown, structure 200 includes a substrate 202, which may be (in one example) a bulk semiconductor material such as, for example, a bulk silicon wafer. As another example, substrate 202 may be any silicon-containing substrate including, but not limited to, silicon (Si), single crystal silicon (Si), polycrystalline Si, amorphous Si or the like. Substrate structure 202 may in addition, or instead, include various isolations, dopings and/or device features. Optionally, substrate structure 202 may include an insulating substrate layer which, for instance, may be, or include, a buried dielectric layer such as, for example, a buried oxide (BOX) layer, silicon-on-nothing (SON), silicon-on-insulator or the like. As one skilled in the art will understand, a buried oxide layer may be fabricated by employing SIMOX (Separation by Implanted Oxygen) technique which, for instance, may include implanting high doses of oxygen ($O^+$) ions into the silicon substrate, and annealing at a high temperature to form a layer of buried oxide over the silicon substrate. In such an example, the fabrication of the buried oxide layer may result in a residual layer of semiconductor material (not shown) which, for instance, may include a silicon material, being disposed over the insulating substrate layer (not shown).

Continuing with FIG. 2, one or more fin structures or fins 204 may be formed extending from substrate 202. By way of an example, fins 204 may be formed by patterning one or more portions of substrate 202, thereby creating one or more fins 204 of the same semiconductor material as the substrate 202, for example, silicon material. In one example, formation of fins 204 may be achieved by patterning the substrate 202 using any of various approaches including: direct lithography; sidewall image transfer technique; extreme ultraviolet technique (EUV); e-beam technique; litho-etch litho-etch or litho-freeze-litho-etch. Following patterning, the removal may be performed, for example, by any suitable etching process, such as, anisotropic dry etching processes, for instance, reactive-ion-etching (RIE) process. Although not critical to the invention, fins 204 may have any suitable height.

Continuing further with FIG. 2, although evenly spaced fins with similar dimensions may be obtained after a conventional fabrication processing, in one implementation, the distance between two adjacent fins may also be varied depending upon the various process parameters employed. As illustrated, while two adjacent fins (for instance, fins 204a and 204b) may be spaced closer (for instance, distance D2), the distance between adjacent fins (for instance, fins 204b and 204c) may also be varied by distance D1. As described further below, these variations in distances between the fins facilitates forming various pull-up transistors, pull-down transistors and pass-gate transistors of the SRAM device, during subsequent fabrication processing. For instance, in one embodiment, the pair of fins 204a and 204b may be utilized to form one or more pull-down transistors and one or more pass-gate transistors, while the isolated fin 204c may be utilized to form one or more pull-up transistors.

Figure 3:
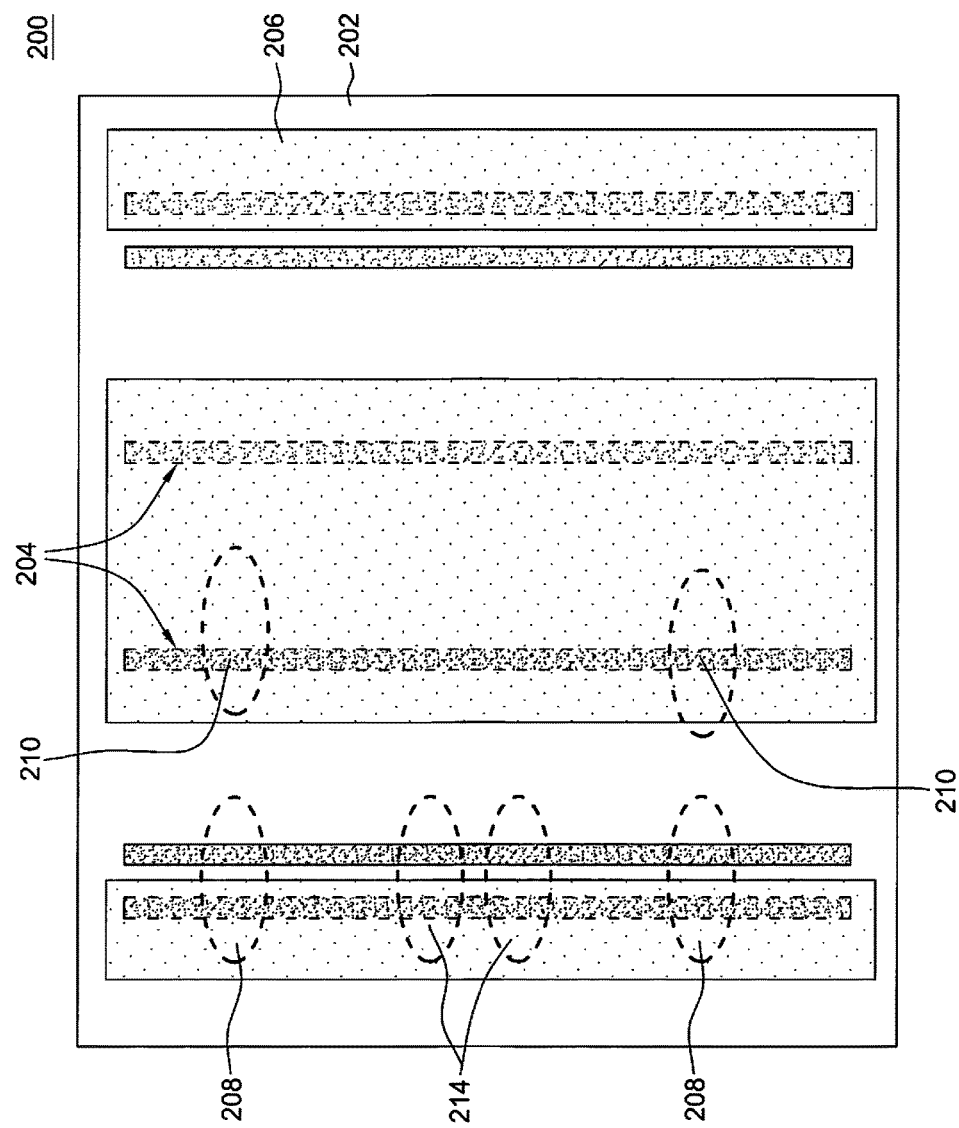
FIG. 3 is a plan view of the structure of FIG. 2 with one or more first lithographic mask layer(s) having been disposed over the fin(s), in accordance with one or more aspects of the present invention.

FIG. 3 is a plan view of the structure of FIG. 2 with one or more first lithographic mask layer(s) 206 having been disposed over the fin(s) 204, in accordance with one or more aspects of the present invention. By way of an example, the first lithographic mask layer(s) 206, which, for instance, may include, or be fabricated of a photoresist material or a photosensitive dielectric material, such as, photosensitive polyimide, and may be deposited using conventional deposition processes, such as, spin-on coating. This first lithographic mask layer 206 may be used, in part, to protect and/or preserve the smaller features of the fins 204 than can be protected using a conventional organic mask layer. As depicted, the first lithographic mask layer 206 may be selectively disposed over fin 204a of the pair of fins 204a and 204b, while the fin 204b is exposed, thereby defining one fin of the pull-down fin region 208, as well as one fin of the pass-gate fin region 214, upon which the pull-down transistor and the pass-gate transistor can be fabricated respectively, during subsequent fabrication processing. Further, as depicted, one of the first lithographic mask layer(s) 206 is spaced parallel to another first lithographic mask layer 206 which, for instance, facilitates defining the pull-up fin region 210, upon which the pull-up transistor of the SRAM device can be fabricated, during subsequent fabrication processing.

Figure 4:
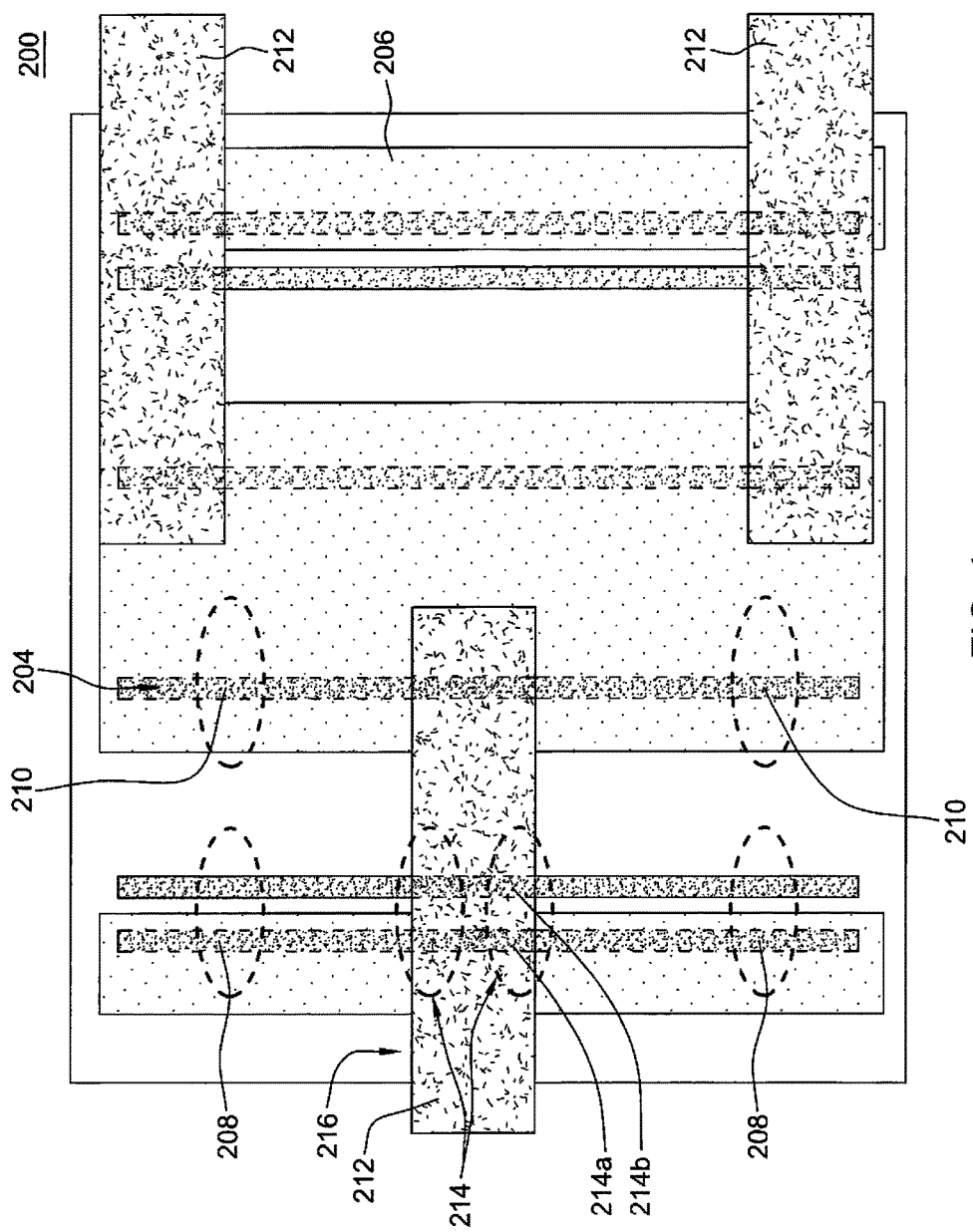
FIG. 4 is a plan view of the structure of FIG. 3 with one or more cut mask layer(s) having been disposed orthogonal to the first lithographic mask layer(s) over the fin(s), in accordance with one or more aspects of the present invention.

FIG. 4 is a plan view of the structure of FIG. 3 with one or more cut mask layer(s) 212 having been disposed over the fin(s) 204, in accordance with one or more aspects of the present invention. As illustrated, the cut mask layer(s) 212 are formed orthogonal to the first lithographic mask layer(s) 206 disposed over fins 204 at selected areas, thereby defining pass-gate fin portion 214a and pass-gate fin portion 214b of the one or more pass-gate fin regions 214, upon which the pass-gate transistor could be formed, during the subsequent fabrication processing. By way of example, the cut mask layer(s) 212 may include, or be fabricated of, a photoresist material or a photosensitive dielectric material such as, photosensitive polyimide and may be deposited using a variety of conventional deposition processes, such as, for example, spin-on coating or the like. In one embodiment, the first lithographic mask layer 206 and the cut mask layer 212 together define one example of the first mask layer 216 of the present invention. As understood, in one embodiment, the materials of the first lithographic mask layer 206 and the cut mask layer 212 may be same photoresist materials, or different photoresist materials, depending upon the processing node in which the SRAM device is being fabricated. Note that, as illustrated, the first lithographic mask layer 206 and the cut mask layer 212 together facilitate defining one fin of the pull-down fin region 208 and pass-gate fin region 214. Although not depicted in the figures, one skilled in the art will understand, one or more conventional processing steps may be performed employing the first lithographic mask layer 206 and the cut mask layer 212 to form a hard mask pattern (not shown) on the substrate 202.

Figure 5:
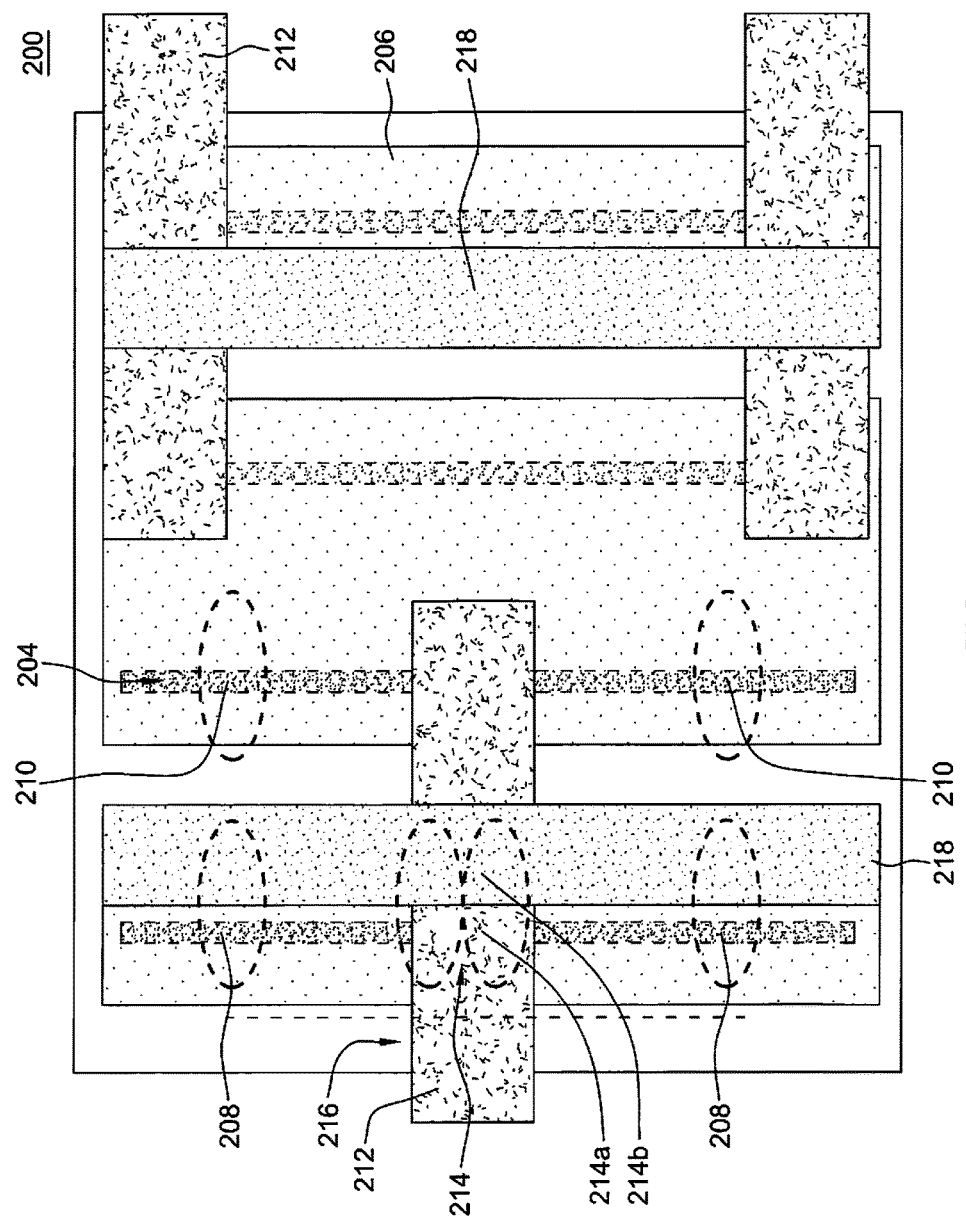
FIG. 5 is a plan view of the structure of FIG. 4 after providing one or more second lithographic mask layer(s) orthogonal to the cut mask layer(s) over the fin(s), in accordance with one or more aspects of the present invention.

FIG. 5 is a plan view of the structure of FIG. 4 after providing a second mask layer, such as, for instance, a second lithographic mask layer 218, orthogonal to the cut mask(s) 212, in accordance with one or more aspects of the present invention. By way of an example, the second lithographic mask, may be, or include, a photoresist or a photo-sensitive dielectric material such as, photosensitive polyimide, and may be deposited using a variety of conventional deposition techniques, such as, for instance, spin-on coating, or the like. As depicted, the second lithographic mask layer 218 is disposed over the fins 204, and spaced parallel to the first lithographic mask layer 206, thereby defining a second fin of pull-down fin region 208 and pass-gate fin region 212. Note that, as illustrated, the cut mask layer 212 is disposed over the adjacent pass-gate fin portion 214a of the pass-gate fin region 214. Although not depicted in the figures, in one embodiment, the pass-gate fin that may be patterned by the cut mask(s) 212, during the forming of the hard mask pattern (not shown), can be recovered using the second lithographic mask layer 218.

Figure 6:
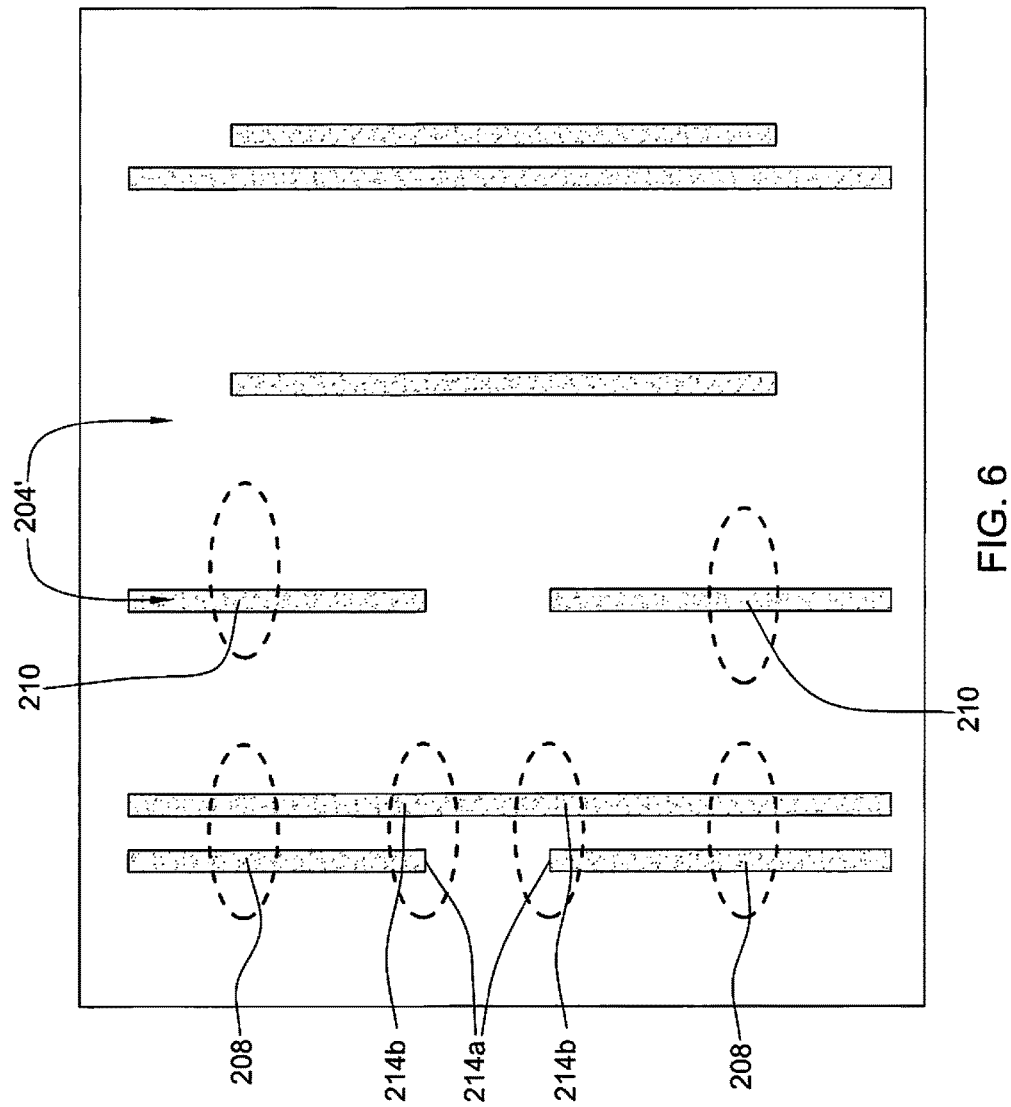
FIG. 6 is a plan view of the structure of FIG. 5 after patterning the fin(s), for instance, using the cut mask layer (s), to define a pass-gate transistor, in accordance with one or more aspects of the present invention.

Continuing with FIG. 5, the etching process may be performed selectively using the cut mask layer 212, by employing one or more conventional anisotropic dry etching processes, such as, for instance, reactive ion etching (RIE), or one or more conventional isotropic wet etching processes to selectively remove a portion of the fin 204, for instance, to obtain one or more patterned fin(s) 204' (see FIG. 6), particularly, at the pass-gate fin portion 214a of the pass-gate fin region(s) 214. Further, the etching processes may be accomplished by modifying the process parameters so as to remove a portion of the fin uniformly at the cut mask layer 212, leaving pass-gate fin portions 214a with square edges, as depicted in FIG. 6. The squared edges of the pass-gate fin portions 214a facilitate encapsulating and/or tucking completely the pass-gate fin portions 214a within an overlying gate structure, which, in turn, protects the pass-gate fin portions 214a from subsequent epitaxial growth processes during later epitaxial processing, as described further below. Still further, as depicted, the etching processes may be accomplished using process parameters that are selective to the cut mask layer, without affecting the adjacent lithographic mask layer 218, thereby protecting the underlying adjacent pass-gate fin portion 214b of the pass-gate fin region(s) 214. This, in turn, facilitates electrically coupling the pass-gate fin portions 214b of the pass-gate fin region(s) 214, while electrically isolating the pass-gate fin portions 214a of the pass-gate fin region(s) 214. Such selective electrical isolation of the pass-gate fin portions 214a and/or electrical coupling of the pass-gate fin portion(s) 214b of the pass-gate fin regions 214, advantageously, improves the beta ratio of the resultant SRAM device. As used herein, the "beta ratio" refers to the ratio of the drive currents of the pull-down transistors to the drive currents of the respective pass-gate transistors. Although not depicted in the figures, as one skilled in the art will understand, the remaining first and second mask layers, e.g., first lithographic mask layer 206, cut mask layer 212 and the second lithographic mask layer 214 can be subsequently be removed utilizing a resist stripping process, such as, for example, ashing.

Figure 7:
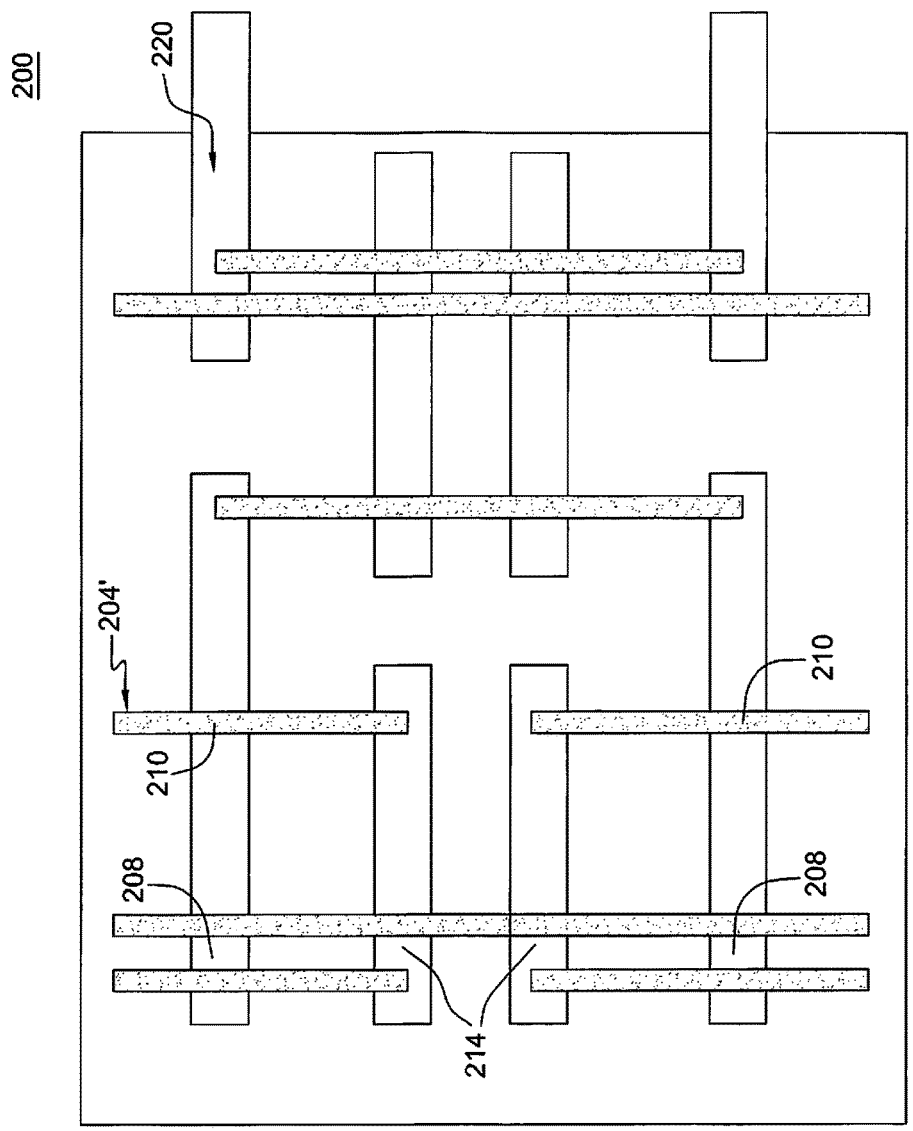
FIG. 7 is a plan view of the structure of FIG. 6 with gate structure(s) having been provided over the patterned fin(s), in accordance with one or more aspects of the present invention.
Figure 8:
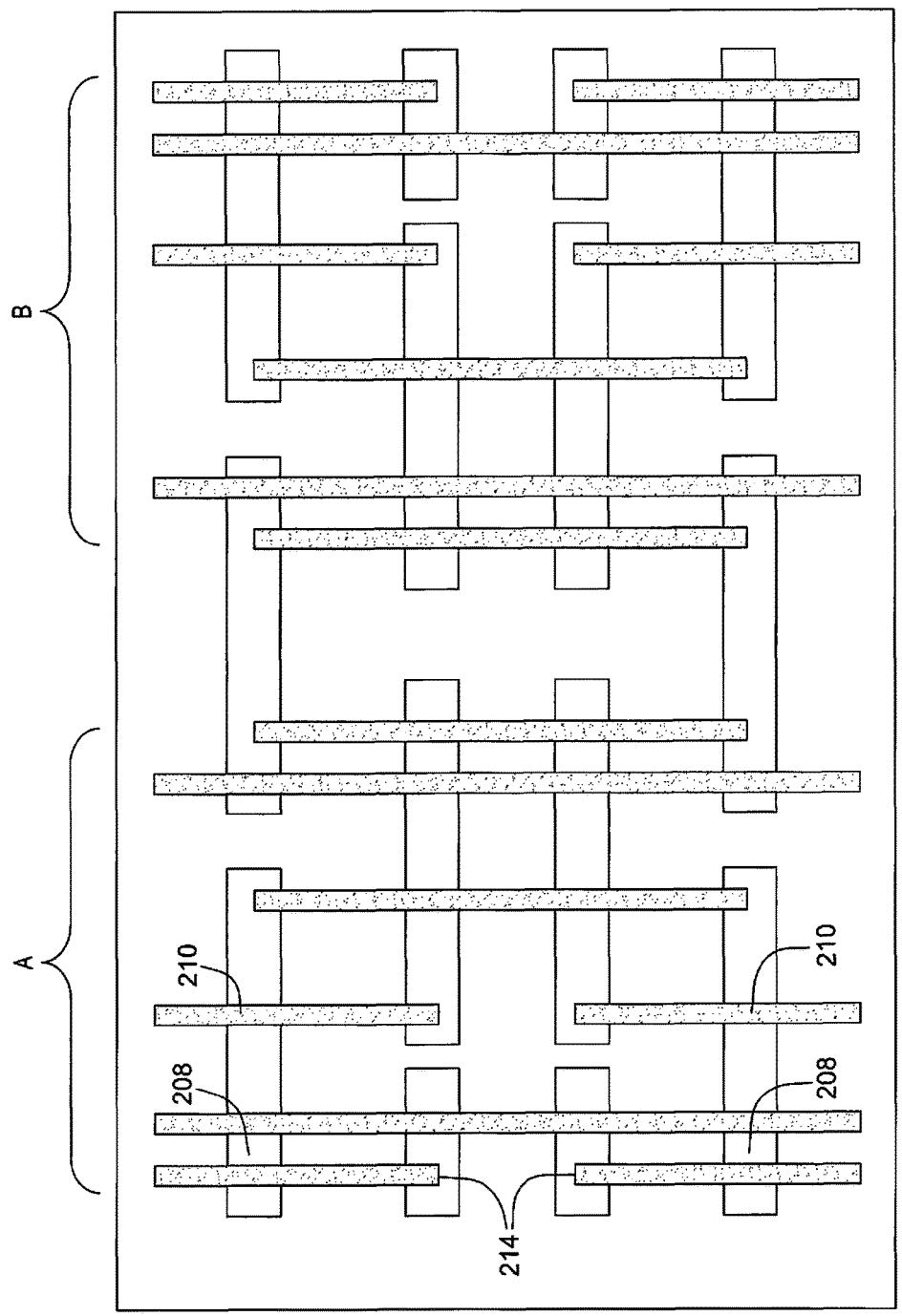
FIG. 8 is a plan view of a resultant structure of FIG. 7 after expanding the structure during the SRAM fabrication process, in accordance with one or more aspects of the present invention.

FIG. 7 is a plan view of the structure of FIG. 6 after providing one or more gate structure(s) 220 extending at least partially over the patterned fin(s) 204', in accordance with one or more aspects of the present invention. As depicted, the gate structure(s) 220 may extend over fins 204', and may overlap fins 204' in selected areas to operate as, for instance, the pull-down transistor 208, pull-up transistor 210 and pass-gate transistor 214 of a SRAM device, respectively. As depicted, and described above, each pass-gate fin portion 214a of the pass-gate transistor 214 is electrically isolated from the pass-gate fin portion 214a of the adjacent pass-gate transistor 214, while the pass-gate fin portion 214b of the pass-gate transistor 214 is electrically connected to the pass-gate transistor 214. Further, each of the pass-gate transistor is electrically connected to the pull-down transistor 208. Such selective electrical isolation of the pass-gate fin portions 214a and/or electrical coupling of the pass-gate fin portion(s) 214b of the pass-gate fin regions 214, advantageously, improves the beta ratio of the resultant SRAM device. In one example, the enhanced beta ratio of the SRAM device may be about 2.0 or more. Further, as illustrated, each of the pull-down transistor 208 is electrically connected to pull-up transistor 210. Additionally, and as one skilled in the art will understand, structure 200 may be expanded to form one or more regions, i.e., regions A and B, to form a SRAM device, as depicted in FIG. 8.

By way of an example, and as one skilled in the art will understand, a gate material (not shown) may be provided over one or more layers (not shown), such as, for instance, a gate dielectric layer and/or work function layer to form gate structure 220. In one example, the gate material may include, or be fabricated of, a metal, and may be formed as a part of a gate-first fabrication process. In this example, the gate dielectric layer may include, or be fabricated of, a high-k dielectric material with a dielectric constant k greater than the dielectric constant of silicon dioxide (k=3.9 for $SiO_2$), and may be deposited by performing a suitable deposition process, such as atomic layer deposition (ALD), chemical vapor deposition (CVD) or the like. In a particular example, dielectric layer (not shown) may have a dielectric constant greater than 4.0, and more preferably, greater than 8.0. Examples of high-k dielectric materials which may be used in the dielectric layer include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, and a silicate thereof, and an alloy thereof, where x=0.5 to 3, and y=0 to 2. The gate material (not shown) disposed over the gate dielectric layer may include, or be fabricated of a material such as, for instance, zirconium, tungsten, tantalum, hafnium, titanium, aluminum, or the like. Alternatively, in another example, the gate material may include, or be fabricated of, a sacrificial gate material, such as an amorphous silicon (a-Si) or polycrystalline silicon (polysilicon), which may subsequently be replaced with a replacement gate material, as part of a gate-last fabrication process.

Figure 9:
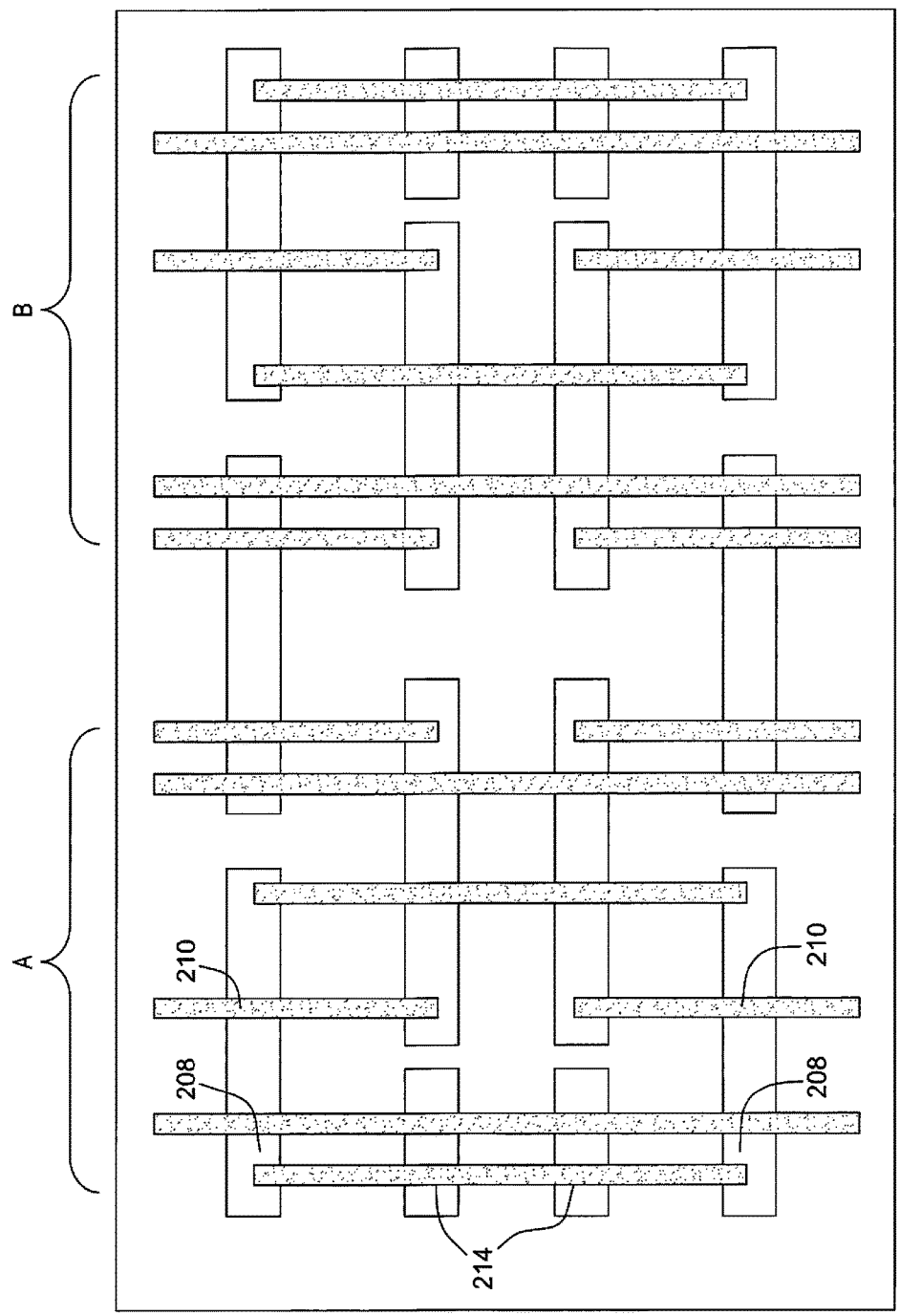
FIG. 9 is a plan view of an alternate embodiment of a resultant structure of FIG. 5 with the stability of the semiconductor memory device having been modulated, in accordance with one or more aspects of the present invention.

In an enhanced embodiment of the present invention, although not depicted in the figures, the positioning of the cut mask layer 212 (see FIG. 4) may be selectively altered to modulate the stability of the SRAM device. By way of an example, the cut mask layer 212 may be positioned such that the resultant patterning processing, subsequent to the providing of the second mask layer 218 (see FIG. 5), results in removing a portion of fin 204, for instance, to obtain one or more patterned fin(s), particularly, at the pull-down fin region 208, selective to the pass-gate fin region 214, as depicted in FIG. 9. Further, the etching processes may be modified so as to remove a portion of the fin uniformly at the cut mask layer, leaving the desired pull-down fin portion(s) at the pull-down fin region 208 with square edges, as depicted in FIG. 9. The square edges of the pull-down fin region 208, advantageously, may be tucked completely within an overlying gate structure. Such patterning of the pull-down fin region 208 results in the beta ratio of about 0.5. Still further, as one skilled in the art will understand, the processing techniques described herein may be extended to achieve the desired alpha ratio and/or gamma ratio of the resultant SRAM device, thereby modulating the overall stability of the SRAM device. As understood, the "alpha ratio" refers to the ratio of the drive currents of the pull-up transistors to the drive currents of the respective pull-down transistors, while the "gamma ratio" refers to the ratio of the drive currents of the pass-gate transistors to the drive currents of the respective pull-up transistors.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the present invention for various embodiments with various modifications as are suited to the particular use contemplated.

What is claimed is:

1. A method for forming a semiconductor memory device, the method comprising:
   providing at least two mask layers over a pair of fin structures extended above a substrate, a first mask layer of the at least two mask layers being orthogonal to a second mask layer of the at least two mask layers, wherein the first mask layer of the at least two mask layers facilitates modulating stability of the semiconductor memory device, without affecting the second mask layer of the at least two mask layers; and
   patterning the pair of fin structures,
   wherein the first mask layer facilitates partially removing a pair of pull-down fin regions of the first fin structure of the pair of fin structures,
   the second mask layer protects a second fin structure of the pair of fin structures to define a fin portion of a transistor, and
   the first mask layer comprises a first lithographic mask layer and a cut mask layer, the first lithographic mask layer being orthogonal to the cut mask layer, wherein the cut mask layer facilitates removal of the pull-down fin regions.

2. The method of claim 1, further comprising altering positioning of the first mask layer of the at least two mask layers to modulate the stability of the semiconductor memory device.

3. The method of claim 2, wherein altering the positioning of the first mask layer facilitates modifying at least one of a beta ratio, an alpha ratio and a gamma ratio of the semiconductor memory device.

4. The method of claim 1, further comprising forming a pair of gate structures over remaining portions of the pull-down fin regions of the first fin structure, such that each remaining portion of the pull-down regions of the first fin structure is tucked under one of the pair of gate structures.

5. A method for forming a semiconductor memory device, the method comprising:
   providing a first fin structure and a second fin structure extended above a substrate;
   forming a first lithographic mask layer on the first fin structure without covering the second fin structure;
   forming a cut mask layer over the first and second fin structures orthogonally to the first lithographic mask layer, wherein the cut mask layer covers opposing pull-down fin regions of the first and second fin structures;
   forming a second mask layer on the second fin structure, the first lithographic mask layer, and a portion of the cut mask layer without covering the first fin structure; and
   removing a portion of the opposing pull-down fin regions of the first fin structure via the cut mask layer, wherein the second mask layer prevents the opposing pull-down fin regions of the second fin structure from being removed, such that the first lithographic mask layer modulates stability of the semiconductor memory device without affecting the second lithographic mask layer.

6. The method of claim 5, further comprising altering a position of the first and second lithographic mask layers before removing the opposing pull-down fin regions of the first fin structure via the cut mask layer.

7. The method of claim 6, wherein the altering the position of the first and second lithographic mask layer modifies at least one of a beta ratio, an alpha ratio and a gamma ratio of the semiconductor memory device.

8. The method of claim 5, further comprising forming a pair of gate structures over the first fin structure, wherein each of the pair of gate structures is positioned over a remaining portion of one of the opposing pull-down fin regions.

9. The method of claim 8, wherein each remaining portion of the opposing pull-down fin regions is tucked under one of the pair of gate structures.

\* \* \* \* \*